United States Patent
Gao

(10) Patent No.: US 12,216,025 B2
(45) Date of Patent: Feb. 4, 2025

(54) ADVANCED SEALING STRUCTURE FOR LIQUID COOLING

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 860 days.

(21) Appl. No.: 17/195,013

(22) Filed: Mar. 8, 2021

(65) Prior Publication Data

US 2022/0283050 A1 Sep. 8, 2022

(51) Int. Cl.
*G01M 3/16* (2006.01)
*G01M 3/04* (2006.01)
*G01M 3/20* (2006.01)
*H05K 7/20* (2006.01)

(52) U.S. Cl.
CPC .............. *G01M 3/16* (2013.01); *G01M 3/042* (2013.01); *G01M 3/20* (2013.01); *H05K 7/20254* (2013.01); *H05K 7/20736* (2013.01); *H05K 7/20781* (2013.01)

(58) Field of Classification Search
CPC ........ G01M 3/042; G01M 3/045; G01M 3/20; H05K 7/20254; H05K 7/20781
See application file for complete search history.

(56) References Cited

U.S. PATENT DOCUMENTS

| | | | |
|---|---|---|---|
| 4,730,665 A | 3/1988 | Cutchaw | |
| 6,826,948 B1* | 12/2004 | Bhatti | G01M 3/188 73/49.1 |
| 9,420,728 B2* | 8/2016 | Desiano | H05K 7/20263 |
| 2005/0092070 A1 | 5/2005 | Bhatti | |
| 2019/0368832 A1 | 12/2019 | Huang | |

(Continued)

FOREIGN PATENT DOCUMENTS

| JP | H01241154 A | 9/1989 |
|---|---|---|
| JP | H11163572 A | 6/1999 |
| JP | H11346079 A | 12/1999 |

(Continued)

OTHER PUBLICATIONS

Lee, Water Leak Detection Attachment for the Liquid Transportation Pipe, May 2014, FIT Machine Translation (Year: 2014).*

*Primary Examiner* — Erika J. Villaluna
(74) *Attorney, Agent, or Firm* — WOMBLE BOND DICKINSON (US) LLP

(57) ABSTRACT

A multi-layer seal formed with a first layer for visual detection of leak by incorporating coloring agent that is water soluble, a second layer for electrical detection of a leak by a sensor, the second layer incorporating disbursable agent which disburses into the water upon contacting water and causing a change in chemical, and/or electrical property of the water, and a third layer made of water swelling material which swells upon contact with water. The three layers may be arranged in an orientation wherein a leak would first reach the first layer, then reach the second layer, and lastly reach the swelling layer. The sealing layer arrangement may be correlated to the fluid flowing direction. The layers may form independent parts placed side-by-side or may be integrated into a single seal loop.

9 Claims, 9 Drawing Sheets

(56) References Cited

U.S. PATENT DOCUMENTS

2020/0025641 A1  1/2020  Long et al.
2020/0340767 A1  10/2020 Holden et al.

FOREIGN PATENT DOCUMENTS

| JP | 2005033140 A | 2/2005 |
| JP | 2005158101 A | 6/2005 |
| JP | 2006039663 A | 2/2006 |
| JP | 2008016646 A | 1/2008 |
| JP | 2008139498 A | 6/2008 |
| JP | 2014228353 A | 12/2014 |
| JP | 2018018857 A | 2/2018 |
| KR | 101391762 B1 | 5/2014 |

\* cited by examiner

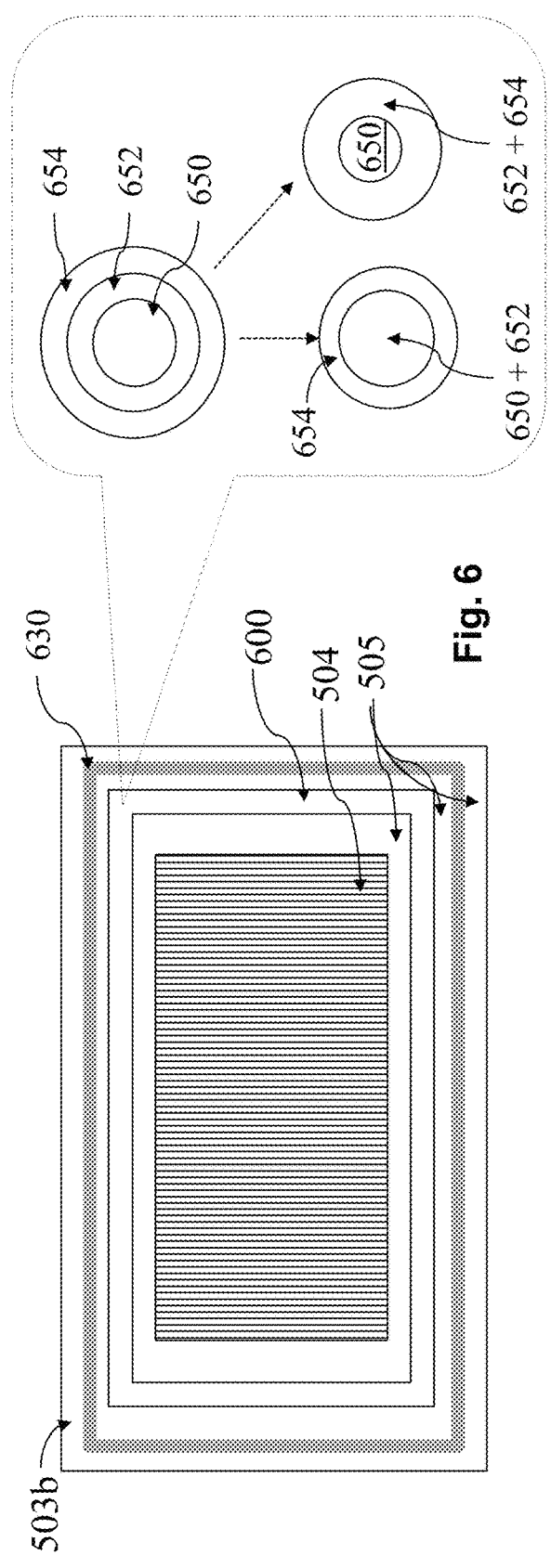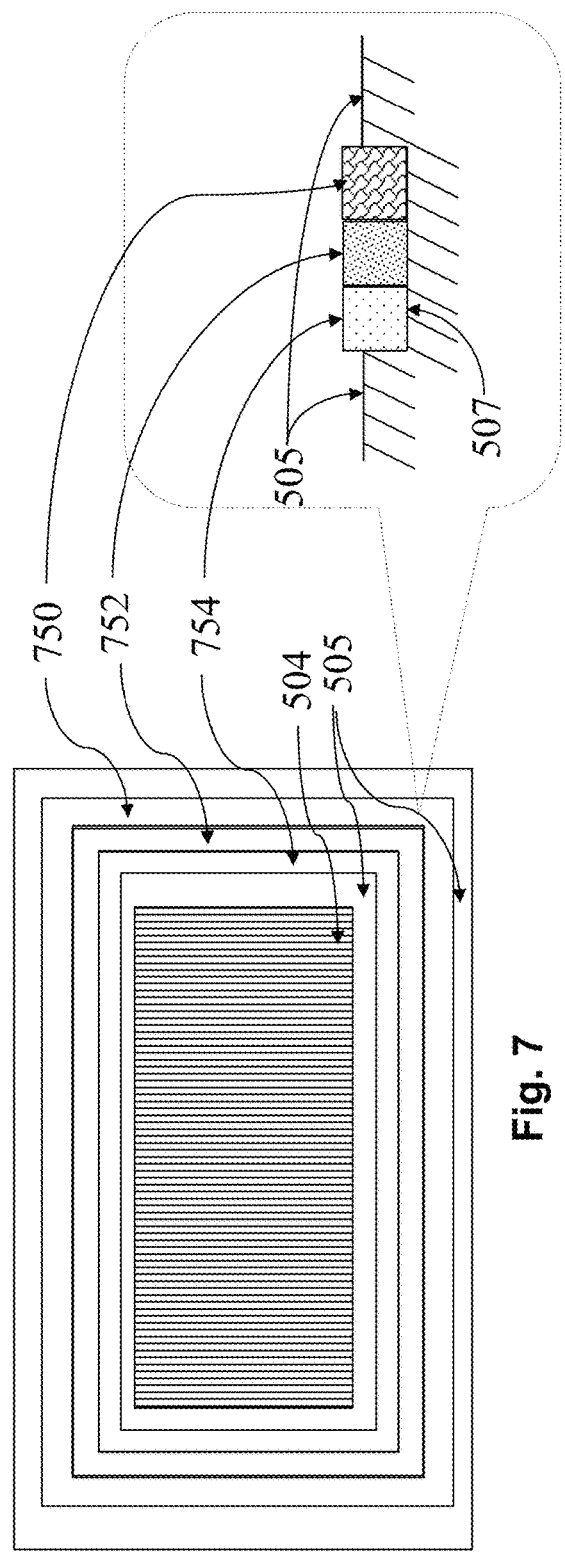

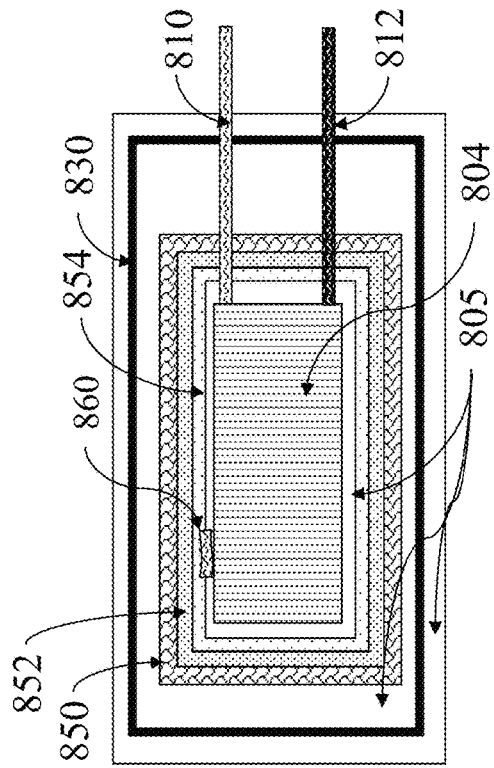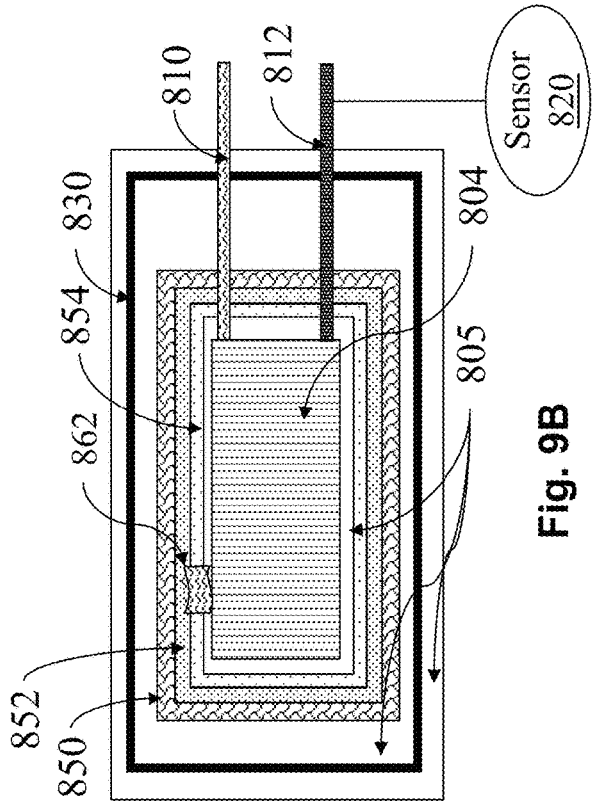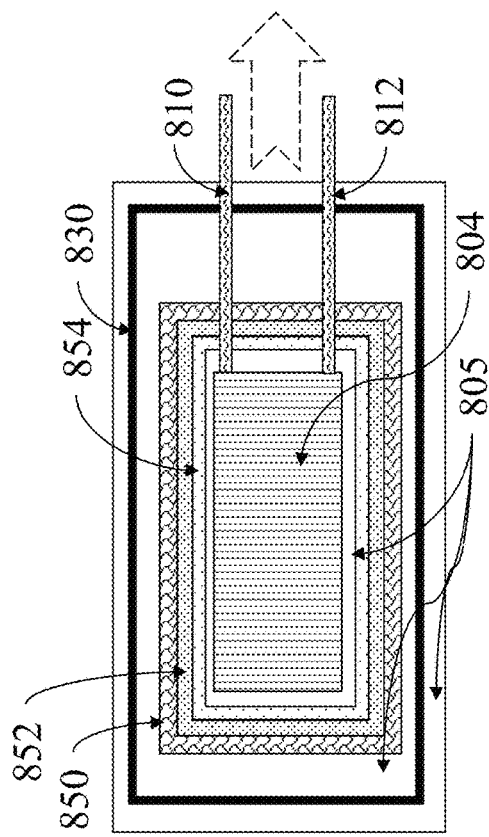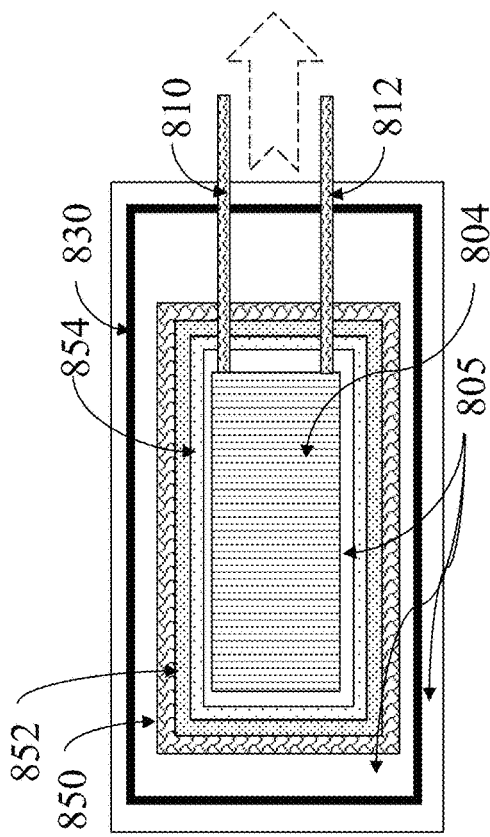

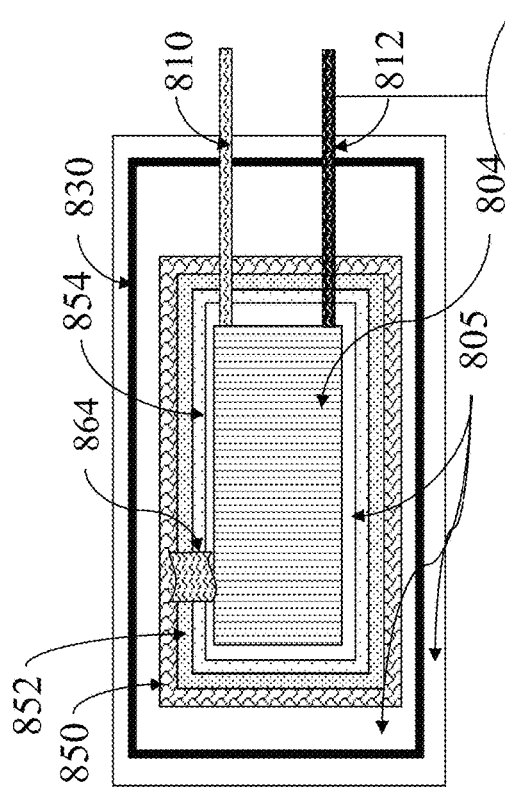
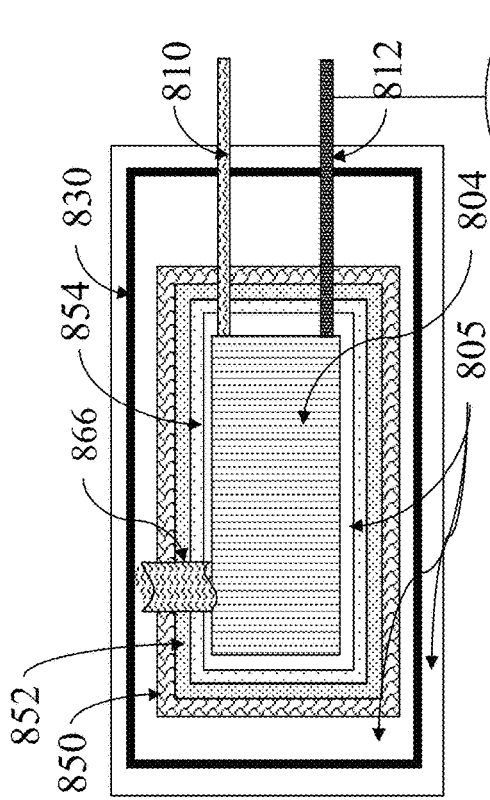
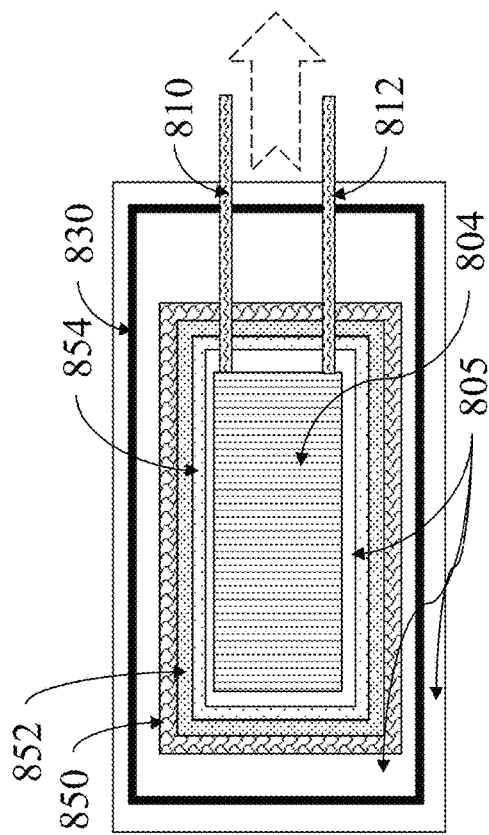
Fig. 10A
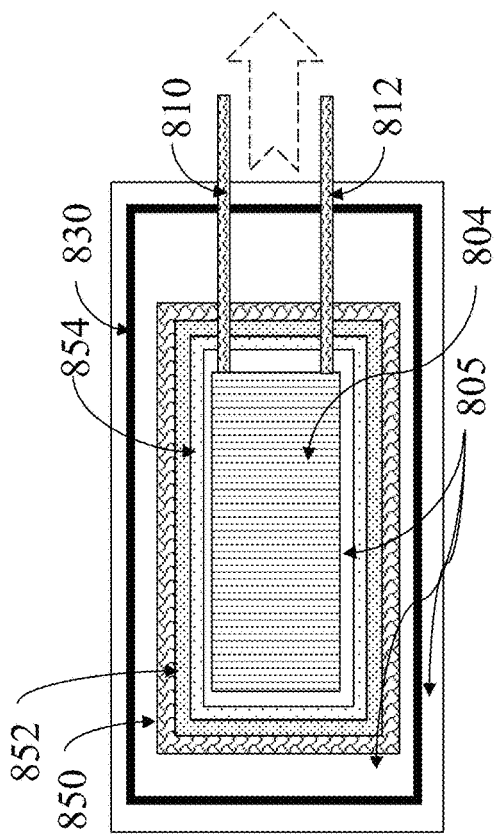
Fig. 11A

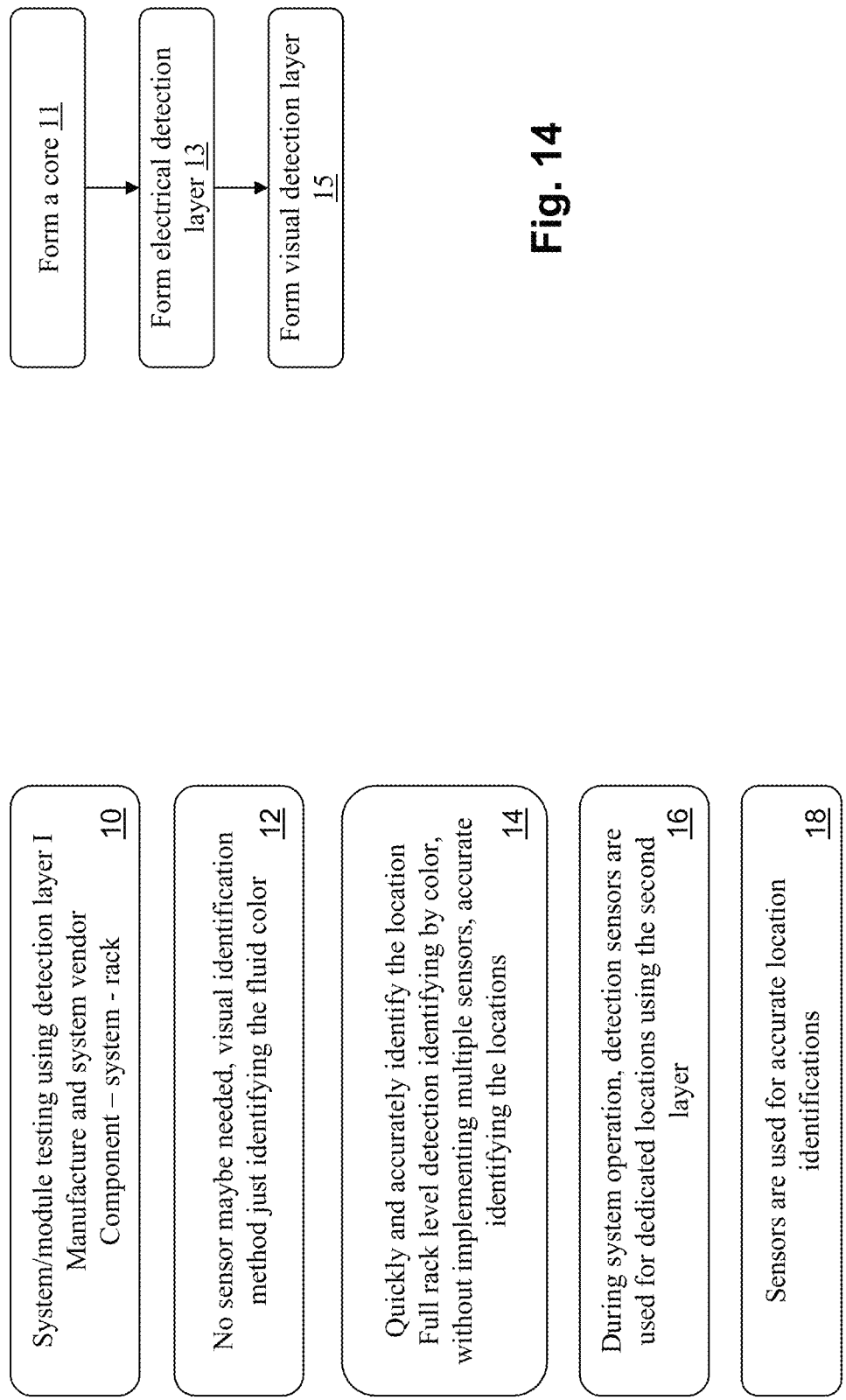

ADVANCED SEALING STRUCTURE FOR LIQUID COOLING

FIELD OF THE INVENTION

Embodiments of the present invention relate generally to servers and to electronics cooling within the data centers. More particularly, embodiments of the invention relate to sealing structures for detecting and preventing cooling liquid leaks.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling high performance servers.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every efforts need to be taken to ensure proper heat removal from these chips. Moreover, the liquid cooling equipment must be highly reliable, since any liquid leaking could potentially destroy those chips, such as shorting the circuits, leading to loss of the hardware, loss of available processing time during the replacement operation, and even potential impact on the service level agreement which was handled during the leak.

While liquid cooling solution must provide the required thermal performance and reliability, since data centers may have thousands of chips requiring liquid cooling, the cost of the liquid cooling system must remain acceptable. The cost of liquid cooling systems may include the cost of proper testing during the manufacturing and integration of the cooling elements into the servers, and the cost of related sensors and leak detectors that may be required to ensure safe operation of the servers.

Liquid cooling devices may be tested during manufacturing by filling them with gas, such as nitrogen, to a preset pressure level, and then monitor whether any pressure drop occurs over a set period of time. However, such test cannot detect internal defects which do not yet manifest as external leakage. Also, while such tests are relatively easy to conduct on single devices, they are very difficult to conduct when many devices are integrated into the server system.

BRIEF DESCRIPTION OF THE DRAWINGS

Embodiments of the invention are illustrated by way of example and not limitation in the figures of the accompanying drawings in which like references indicate similar elements.

FIG. 6 illustrates an integrated apparatus according to an embodiment.

FIG. 7 illustrates a non-integrated apparatus according to an embodiment.

FIGS. 8A-11B illustrate operation of apparatus according to disclosed embodiments in response to leaks of different extent.

FIG. 13 is a conceptual illustration of a method for deploying the leak detection and prevention apparatus, according to an embodiment.

FIG. 14 is a flow chart illustrating a process for fabricating a seal, according to an embodiment.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed embodiments provide mechanisms for both detecting potential leaks and preventing the potential leak from developing into an actual leak. As such, one feature may be referred to as pre-leak detection mechanism. Disclosed embodiments enable pre-leak detection both during the manufacture of the cooling devices and during operation of the cooling devices in the servers.

In disclosed embodiments three levels of safety are incorporated, which complement or replace the standard seal. The three levels may be integrated into a single safety device or be provided as three individual devices. Although it is not mandatory that all three level be used, the incorporation of all three provides synergistic benefits and may in fact reduce the cost of the system by reducing the number of leak detectors required due to increased confidence in the system's reliability.

The following disclosure starts by providing background information regarding the application of the disclosed embodiments, and then proceeds to disclose specific embodiments.

Figure 1:
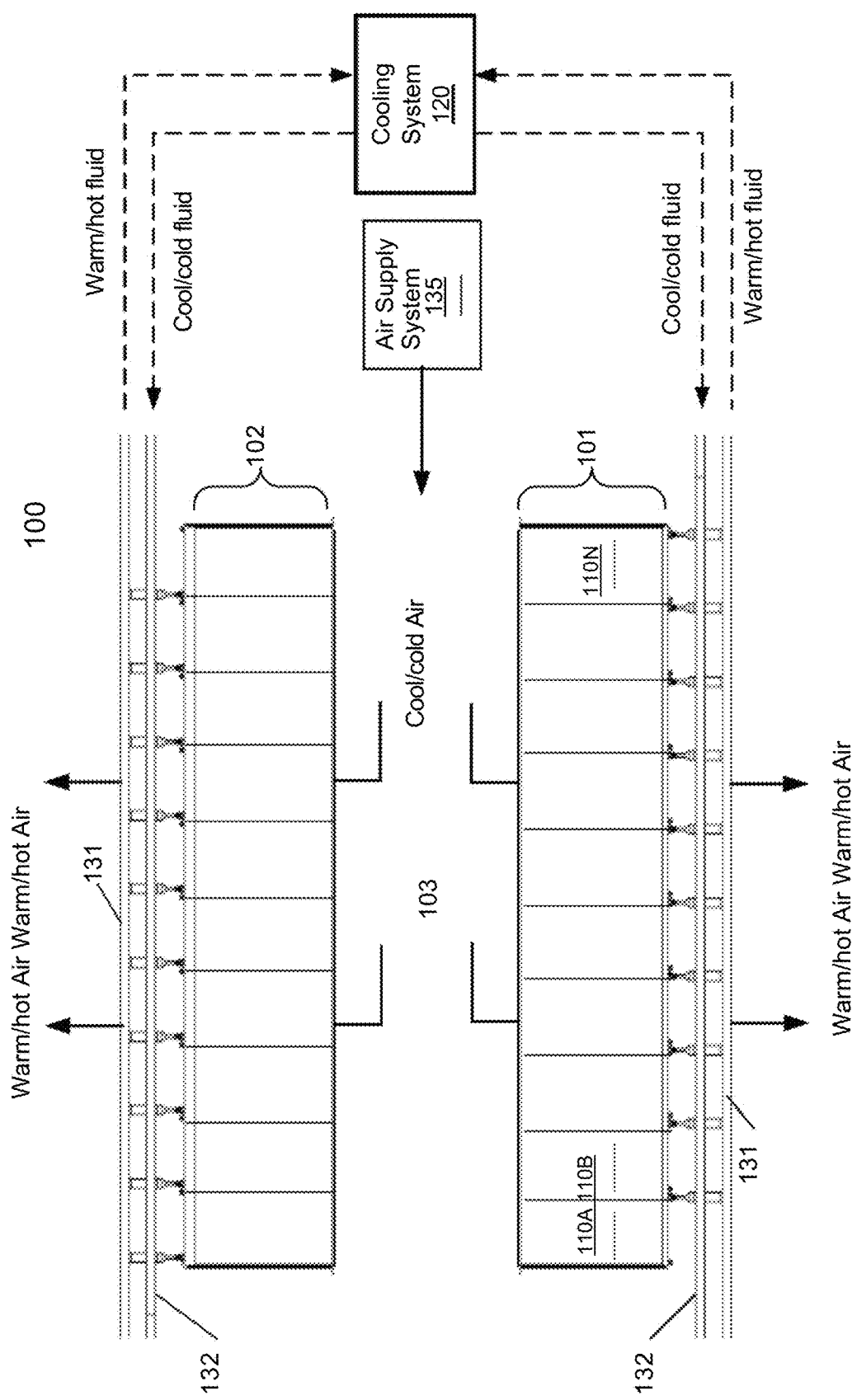
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Moreover, the liquid cooling may be multi-phase system wherein fluid flows in liquid or gaseous phase.

Figure 2:
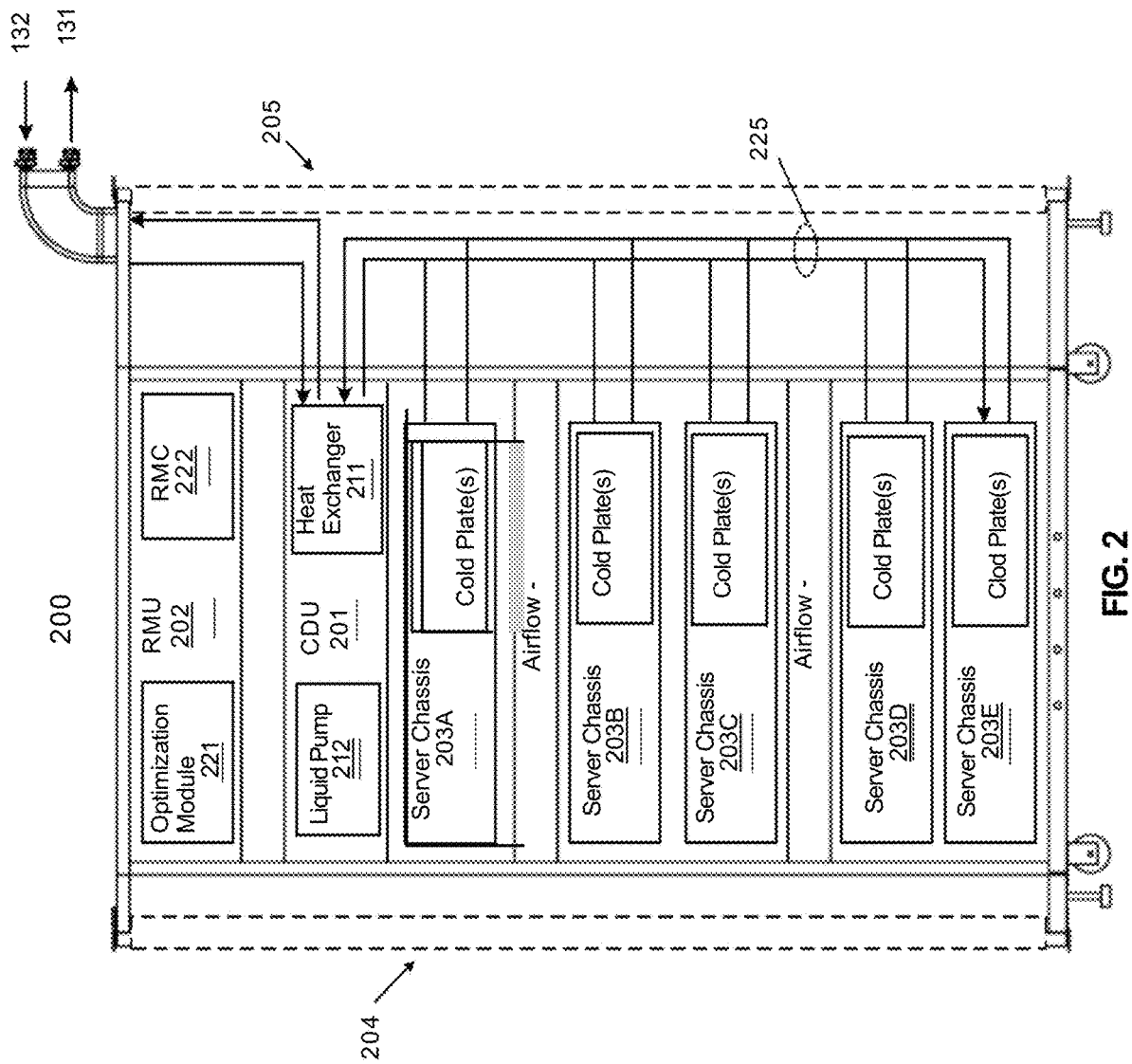
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid or multi-phase heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for the fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of the fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
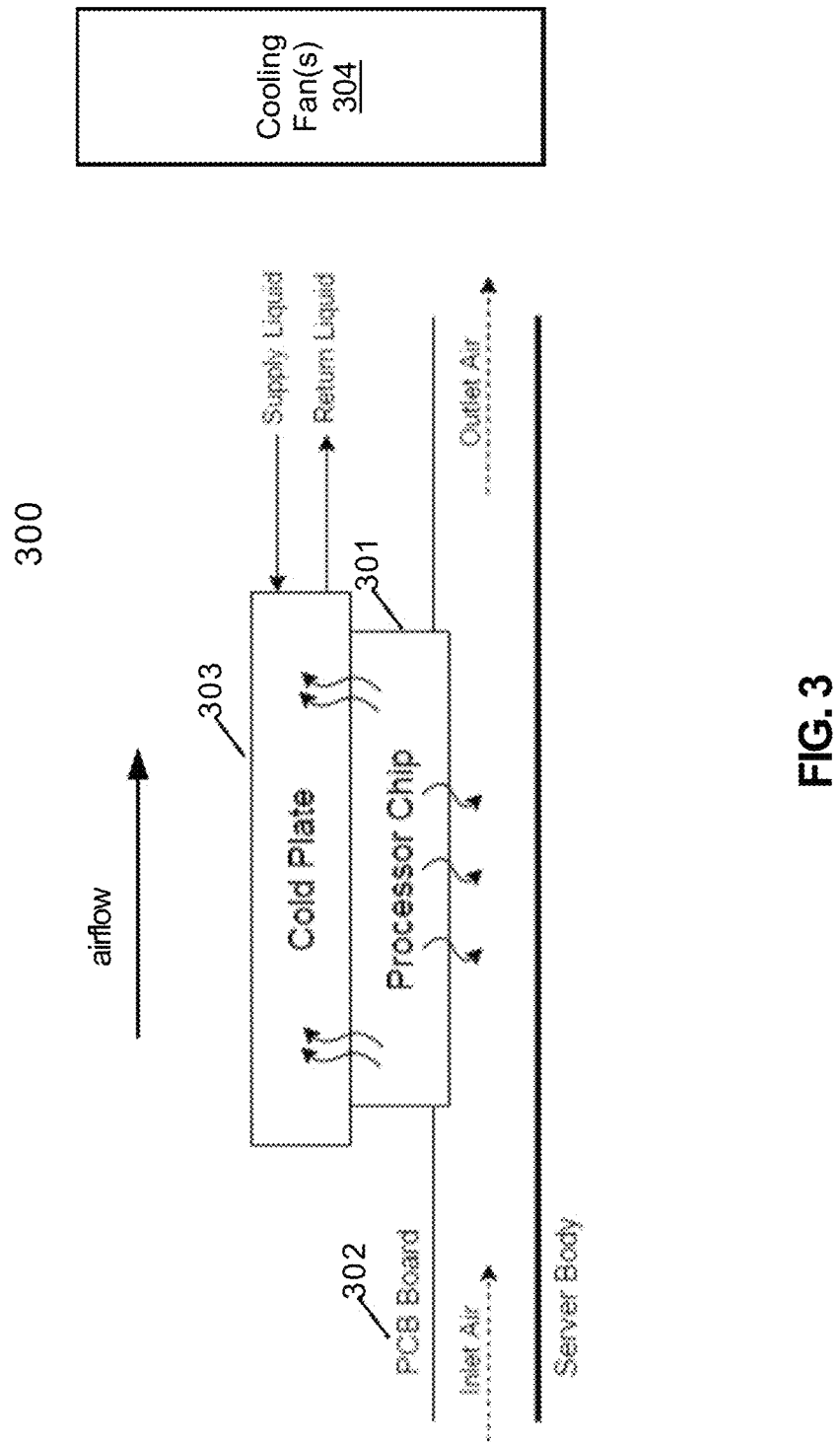
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131 e.g., via blind mate connectors. A portion of the heat generated by processor 301 is removed by the cooling liquid via cold plate 303. The remaining portion of the heat enters into an air space underneath or above, which may be removed by an airflow generated by cooling fan 304.

Figures 4, 5:
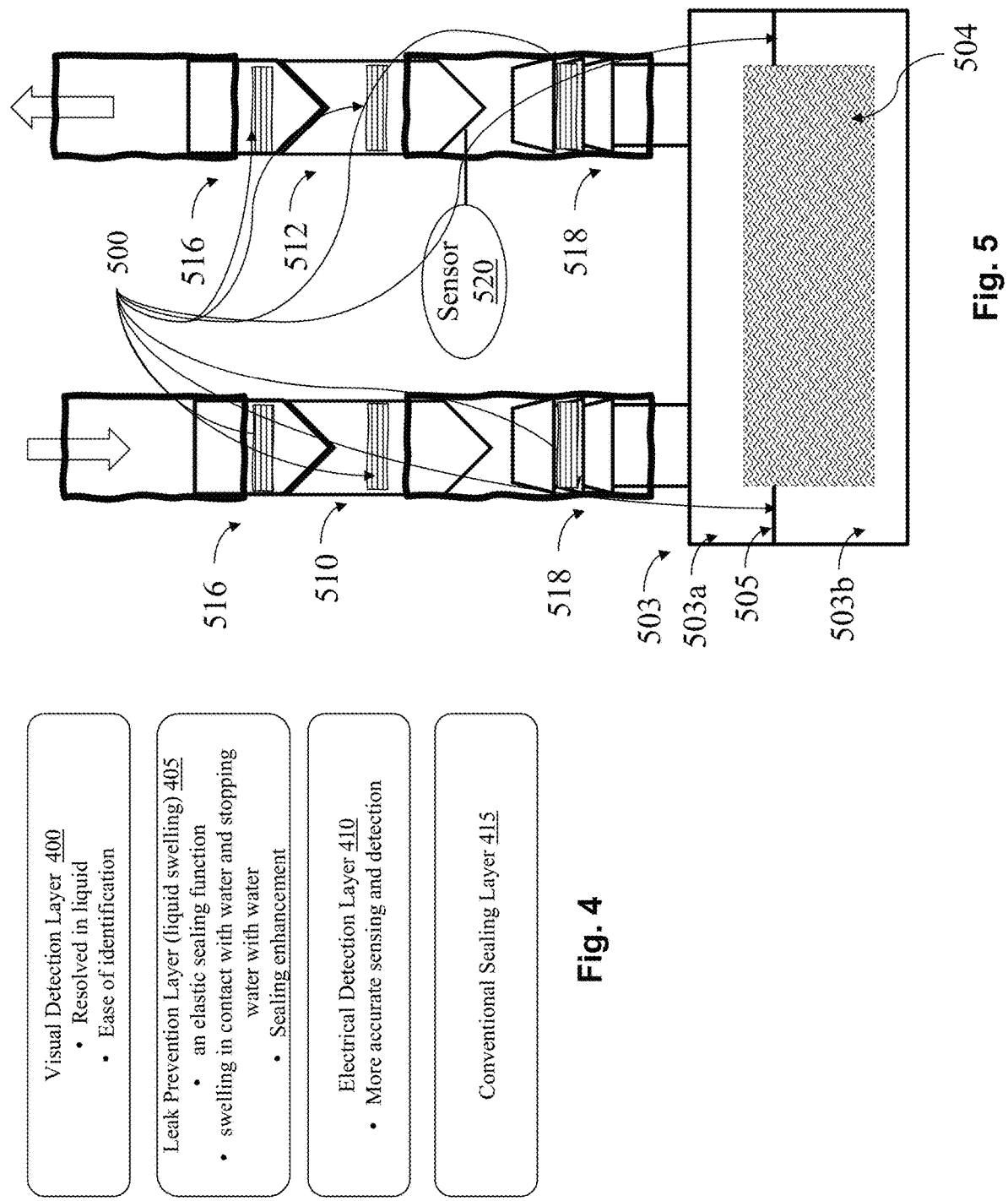
FIG. 4 is a conceptual schematic illustrating leak detection and prevention according to an embodiment.
FIG. 5 is a general schematic of elements of a cooling system where apparatus according to disclosed embodiments may be employed to detect and prevent leaks.

FIG. 4 is a conceptual representation of the layers that may be used in an integrated or non-integrated solution to provide leak detection and protection. These layers may be considered as distinct safety layers, but they may be formed as integrated single device or multiple devices. Here, the visual detection layer 400 should be oriented towards the liquid containment space of a cooling device, while the conventional sealing layer 415 should be the last layer between the containment and the exterior of the device. The order of the leak prevention layer and the electrical detection layer may be changed. The conventional sealing layer is recommended to be designed as the last sealing layer.

The visual detection layer is made of colored material that dissolves in the cooling liquid, e.g., purified water or deionized water. Once the cooling liquid contacts the visual detection layer, the material dissolves and colors the cooling liquid. This feature is particularly beneficial during manufacturing and assembly testing, since the hoses are transparent so it would be very easy to identify the color change of the cooling liquid flowing in the hoses. Moreover, it would also be easy to identify the location of the origin of the color change, thus identifying the device which causes the color changing due to an internal leak. One simple way to make the visual detection layer is to compress dry food coloring powder to form a solid that would easily dissolve upon contact with water. Also, food coloring is non-reactive with the wetted material used for cooling equipment and would not lead to corrosion or other chemical reaction with the cooling equipment. In an embodiment, other type of martials which satisfy the proposed functions maybe used.

Once the liquid cooling system is incorporated into the computing system, the visual detection layer is no longer as useful, since the pipes will be covered with insulation. Even when the pipes remain transparent and the color of the fluid flowing within the hoses is visible, it is not possible to identify the leak since the fluid is flowing fast within the hoses and there is no personnel onsite watching the thousands of operating equipment in real time. Therefore, the electrical detection layer 410 is added for leak pre-detection during normal operation. The electrical detection layer may be implemented using, e.g., nanoparticles or chemical agent that, once added to the cooling liquid, changes the optical, chemical and/or electrical property of the cooling liquid. For example, when the nanoparticles are made of a conductive material, e.g., copper nanoparticles, once the nanoparticles enter the cooling liquid stream the conductivity of the cooling liquid would change and can be detected using electrical sensors. Additionally, the nanoparticles may change the optical property of the water by diffracting light, thus detectable by an optical sensor, which generates a corresponding electrical signal. Nanoparticle or ultrafine particle is usually defined as a particle of matter that is between 1 and 100 nanometers (nm) in diameter. Such particles are too small so may not significantly interfere with the flow of the cooling fluid when introduced into the flow stream. In an embodiment, the nanoparticles may enhance the thermal performance depending on their thermal conductivity and heat retention.

It should be noted that as disclosed herein, the term electrical sensor refers to the sensor providing an electrical signal indicative of a leak. The detection mechanism of the sensor may be electrical, chemical, optical, etc. That is, the term "electrical" does not refer to the manner in which the sensor detects the leak, but rather to the manner in which the sensor communicates the leak. Notably, the communication link may incorporate fiber optics sending light signal, but the signal is generated from an electrical output of the sensor, and thus is included within the term electrical leak detection or electrical sensor.

As will be explained in more details below, the visual detection layer 400 and the electrical detection layer 410 are able to detect a potential leak before it breaches the cooling device and causes damage to the server circuitry. Therefore, the leak prevention layer 405 is added, to further prevent cooling liquid breach and provide sufficient time for the leak to be detected and the faulty part to be replaced prior to causing damage. This is a tremendous advantage of the disclosed embodiments, since a faulty cooling part can be replaced prior to cooling liquid breach and damage caused to an operating server, thus saving costs of server replacement, shortening or avoiding server downtime, and potentially preventing data loss.

In disclosed embodiments the leak prevention layer may be made of a water-swelling material (WSM). The leak prevention layer is integrated with or abating the leak detection layers, so that when water reach the leak detection layer and triggers an alert, it may also reach the leak prevention layer that would swell in response and thus prevent the leak from breaching the device. Water-swelling material may be fabricated, for example, by blending high-absorbency polymer, a filler, and a solvent by using a synthetic resin elastomer as the base material. Another example for WSM is water-swelling rubber (hydrophilic rubber) that may be based on polychloroprene, polychloroprene and EPDM rubber, polyurethane or semi-vulcanized butyl rubber. According to a further example, cellulose component, such as carboxy methyl cellulose, may be used with an acrylate copolymer to increase the swelling capacity of an acrylonitrile butadiene rubber in the presence of cooling liquid, e.g., water.

As illustrated in FIG. 3, the liquid cooling system may include a cold plate 303 and liquid supply and return lines. FIG. 5 illustrates a liquid cooling arrangement while indicating areas susceptible to leaks and where embodiments disclosed herein may be used to detect and prevent leaks. FIG. 5 shows the cold plate 503, which is generally made of two parts, 503a and 503b that are machines to have direct contact surface 505 upon assembly. When the two parts 503a and 503b are assembled, they defines cavity 504 (e.g. microchannel fin area) in which cooling liquid circulates from the supply line 510 to the return line 512. Lines 510 and 512 are attached to the cold plate 503 via barbs 518 and to the cooling manifold via quick disconnects 516. As illustrated, leak detection and prevention devices 500 according to disclosed embodiment may be placed at all location susceptible to leaks, such as, the machined mating surfaces 505 of the cold plate, the barb connectors, and the quick disconnects.

FIG. 5 also illustrates the placement of the electrical detection sensor 520 at the return line 512 of the cold plate 503, such that if change in the return liquid's chemical, optical or electrical property is detected, it stands to reason that it originated upstream of the location of the sensor 520, thus helping to locate the source of the leak. It needs to be mentioned that the sensors are suggested to be added to the fluid downstream of the device.

The disclosure now turns to specific examples for implementing the leak detection and prevention apparatus according to embodiments thereof. FIG. 6 illustrates a top view of part 503b of cooling plate 503, with the top part 503a removed. As explained with respect to FIG. 5, part 503b includes a machined mating surface 505 that surrounds liquid cavity 504. Liquid cavity 504 may include cooling microchannels or any other heat exchange mechanism known in the art. Also, a standard sealing ring 630 may be installed between the two mating surfaces 505. Regardless of the presence of the sealing ring 630, it should be appreciated that when properly machined and assembled, no cooling liquid should be present anywhere on machined mating surfaces 505. Any presence of liquid on any part of surface 505 is referred to herein as internal leak. Note that such an internal leak may be contained interior to the sealing ring 630; however, once the liquid passes beyond seal 630 the leak will breach and may be referred to as external leak. External leak may cause catastrophic damage to the electronic devices it contacts the device. Therefore, disclosed embodiments aim at detecting internal leaks as a forewarning of potentially impending external leak, and aim to prevent external leak for at least sufficiently long to enable replacement of the internally leaking part. This is the sense to which pre-leak detection refers to herein.

The callout in FIG. 6 illustrates a cross-section of the leak detection and prevention apparatus 600 according to an embodiment. In this example, the apparatus 600 provides an integrated solution, wherein the visual detection layer, the electrical detection layer and the leak prevention layer are integrated into a single apparatus 600. Specifically, in this embodiment the apparatus 600 is a rectangular seal, formed as a closed loop, that is installed inwardly of the standard sealing ring 630. As shown in the callout, in this embodiment the core 650 of the seal 600 is made of the water swelling material. A first coating layer 652 is provided over the core 650 and is made of nanoparticles of a chemical change agent. A second coating layer 654 is provided over the first coating layer 652 and is made of coloring material.

With the seal 600 constructed as shown in the callout of FIG. 6, when the mating surfaces 505 were fabricated improperly, or expansion and contraction deformation happens, cooling water will sip in between the mating surfaces 505 and reach the second coating layer 654, which will dissolve and color the cooling liquid. This can be detected during the fabrication testing, prior to integrating the cold plate into an electronic circuit, and prior to applying an insulator to the transparent supply and return lines.

If the initial test was conducted successfully, but during normal operation water starts sipping in between the mating surfaces, due to thermal cycling, corrosion, or other longer term factors, the coloring may not be detected since the transparent lines are covered with opaque insulation. Also, in data center, the color change may quickly disappear since large amount of flowrate is flowing within the hose, as mentioned above. However, once the second coating 654 has been dissolved, if water persists in sipping in between the mating surfaces 505, the first coating layer 652 will start to dissolve, thus releasing nanoparticles into the water stream. This would be detected by the electrical sensor, thus alerting to a potentially failing cold plate prior to water breach.

Moreover, if further water persist sipping, it will activate the swelling property of the core 650, which would expand and act to prevent water breaching and causing external leak. Thus, in addition to enhancing the reliability of the cold plate, the water swelling core 650 provides sufficient time for the engineers to replace the cold plate prior to water breach.

In the main illustration of the callout the core and the two detection layers are illustrated as distinct elements. However, in alternative embodiments some elements may be combined into a single element. For example, the core 650 may be made of water swelling material which is impregnated with nanoparticles or chemical agent. This is illustrated in the left-hand side of the callout. Thus, as the core begins to swell, it would release the nanoparticle or chemical agent, thus enabling detection of the internal leak. Conversely, the first and second detection layer may be combined into a single layer having both coloring material and nanoparticles/chemical agent. This is illustrated in the right-hand side of the callout. If the device fails during fabrication testing, the single layer will be dissolved and the water will be colored. Consequently, the device would be discarded or repaired, in which case a new apparatus 600 would be installed, or a full set of module where 600 is assembled would be replaced. Conversely, if the device passes the fabrication test and is put into service, when water starts sipping, the single layer will be dissolved and the nanoparticles/chemical agent would enable electrical detection of the internal leak.

FIG. 7 illustrates another embodiment wherein each of the leak detection and prevention layers is formed independently. For illustration, this embodiment dispenses with the standard sealing ring, but it may include the sealing ring as with the embodiment of FIG. 6. As shown in the callout, the machined mating surface 505 includes a channel into which the leak detection and prevention layers are inserted. The top part 503a may have matching channel or be machined flat to press upon the layers. Here the first rectangular insert 754 is made of the coloring material and functions as the visual leak detector, the second rectangular insert 752 is made of nanoparticles or chemical agent and functions as the electrical leak detector, and the last rectangular insert 750, which functions as a seal, is made of the water swelling material.

Since the leak detection and prevention apparatus can be made in different shapes, it can be used in any location of the system that is susceptible to springing leaks. Thus, for the cold plates, as shown in FIGS. 6 and 7 the apparatus may be formed as a rectangle loops. On the other hand, by shaping the apparatus as an O-ring, it may be used at the locations of the quick disconnect and barb connections, as illustrated in FIG. 5. In this respect, the use of the term "ring" herein is intended to cover a closed shape or loop and is not limited to a circular shape, just as when used for "boxing ring" wherein it is actually a square.

FIGS. 8A-11B illustrate operation of apparatus according to disclosed embodiments in response to leaks of different extents and which may occur at different times and under different testing or operating environments. For example, FIG. 8A illustrates a properly functioning cold plate having dry mating surface 805 and the conventional sealing ring 830. Additionally, in this example the cold plate includes a visual leak detection layer 854, an electrical leak detection layer 852, and a water swelling layer 850. Water supply line 810 delivers cooling water, which circulate within the cavity

804, e.g., through cooling fins, and return via return line 812 to remove heat from the cold plate.

FIG. 8B illustrates the cold plate of FIG. 8A in a condition wherein a small internal leak 860 has sprung, but it only reaches the visual leak detection layer. As a result of leak 860 reaching the visual leak detection layer 854, color is released into the water and the return line 812 would show that the water is colored, thus indicating an internal defect or fault. The visual leak detection aspect of this embodiment is very useful for a component manufacturer to enable to test the cold plate without the need for any electrical sensors and related circuitry. In addition, this aspect is useful for system vendors to identify the locations of the leak and identify the failure points or units without requiring multiple sensors, especially when multiple cooling units are assembled together. Similarly, system vendors, such as OEM and ODM, may benefit from this aspect as well by the ability to supply a fully tested system. In addition, when conducting the full rack level testing, it can be done without any physical sensors while still being able to accurately locate leaks.

A cold plate may pass all initial leak testing, yet develop leaks at a later point during normal operation due, e.g., to thermal cycling, corrosion, etc. FIG. 9A illustrates a cold plate such as that illustrated in FIG. 8A, in a normal operating condition without any leaks. Conversely, FIG. 9B illustrate the condition wherein a leak 862 has sprung and reaches the electrical leak detection layer 852. Under such a situation, the visual leak detection layer 854 would release its coloring agent, thereby changing the color of the water in the return line and enabling visual identification of the leak, if the transparent return line is not covered by insulators. Additionally, the electrical leak detection layer 852 would release its nanoparticles or chemical agent, thereby changing the chemical or electrical property of the water in the return line 812. At this point, sensor 820 will detect the change in the chemical or electrical property of the water in the return line 812, thereby indicating an internal leak.

The aspect illustrated in FIG. 9B may be useful especially during normal operation in production system. Since the visual leak detection aspect may not function properly in an operating cluster where thousands of machines are installed, making it difficult to see all the return lines or where the return line may be covered by insulators, thus not visible. Therefore, the electrical leak detection layer enables leak detection in actual production environment. The sensor location can be customized for individual module, or one cooling module of a chassis, or an entire rack. Note that since disclosed embodiments provide multiple level of leak detection and prevention, the system's reliability increases such that the number of sensors needed in the system may be reduced. The sensor itself can be designed for either nanoparticle based detection, chemical based detection, or optical detection of light diffraction. If it is chemical based detection, then the electrical leak detection layer 852 may include a chemical agent rather than nanoparticles. For example, the electrical leak detection layer 852 may include a chemical agent that would change the chemistry of the water and the sensor would be a chemistry-based sensor.

FIG. 10A illustrates a cold plate such as that illustrated in FIG. 8A, in a normal operating condition without any leaks. Conversely, FIG. 10B illustrates the condition wherein an internal leak 864 has sprung and reaches the water swelling layer 850. At this point the coloring agent from visual leak detection layer 854 has been dissolved into the water stream. Similarly, the nanoparticle or chemical agent from electrical detection layer 852 has also been released into the water stream, thus triggering an alert. However, in order to prevent the internal leak from progressing to become an external leak, the swelling layer 850 is provided so as to absorb the water from the leak and swell, thus creating a barrier confining the leak within the confines of the water swelling layer.

FIG. 11A illustrates a cold plate such as that illustrated in FIG. 8A, in a normal operating condition without any leaks. Conversely, FIG. 11B illustrate the condition wherein an internal leak 864 has sprung and surpasses the water swelling layer 850. At this point the coloring agent from visual leak detection layer 854 has been dissolved into the water stream. Similarly, the nanoparticle or chemical agent from electrical detection layer 852 has also been released into the water stream, thus triggering an alert. Also, although the swelling layer 850 absorbed the water from the leak and swelled, the leak persisted beyond the water swelling layer 850. At this point, the leak reaches the conventional sealing ring 830 and is maintained within the confines of the sealing ring 830.

Figure 12:
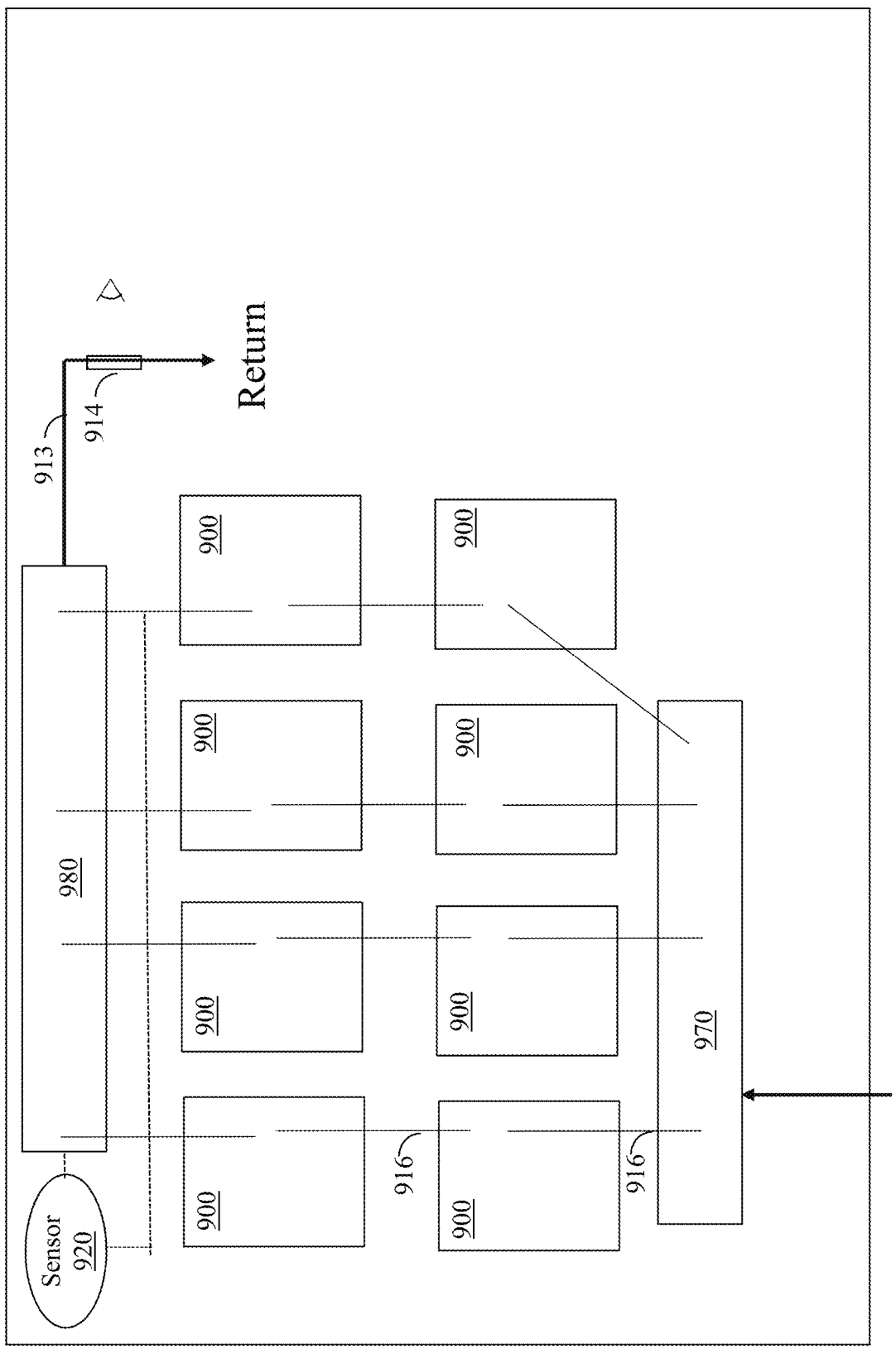
FIG. 12 illustrates an embodiment of a server cooling module incorporating leak detection and prevention apparatus according to an embodiment.

As can be seen from the description of FIGS. 8A-11B, in none of the leaks any water leaked exterior to the cold plate, thus any damage to the electronics has been averted. Thus, the confidence in the reliability of the cooling system is increased, enabling reducing the cost of the leak sensors and related electronics, since the number of leak sensors may be reduced. This is exemplified by the embodiment illustrated in FIG. 12. In FIG. 12 a supply manifold 970 provides cooling water to a plurality of interconnecting lines 916, which deliver the cooling water to a plurality of cold plates 900, which may be connected in any arrangement of parallel and/or serial connections, as shown. The return hot water is collected by the return manifold 980 and directed to the return line. Ideally, each cold plate may have its own electrical leak sensor 920; however, such may prohibitively increase the cost and complexity of the system. As an alternative, the sensor 920 may be provided to the end lines connected to the return manifold 980 and/or to the manifold 980 itself, as illustrated by the dotted lines. Also, the main return line 913 may include a window 914, enabling visual inspection to detect color change of the water or placing an optical sensor. Such a window 914 may also be useful for the system vendors or server vendors who receive cooling modules from the cooling vendors and then assemble the modules to the systems. System vendor will run full testing before shipping to the end user, so window 914 is useful for the system vendors to check the final product prior to shipping.

FIG. 13 is a conceptual illustration of a method for deploying the leak detection and prevention apparatus, according to an embodiment. In block 10 it is exemplified that the visual leak detection layer I can be used during testing by the manufacturer of the cooling components and the system's vendor. The testing may be performed on the component level, the system level and rack level (prior to installing insulation on the water lines). As noted in block 12, electrical leak detection sensors may not be needed during these testing, since visual inspection is sufficient. This simplifies system and rack level testing and, as indicated in block 14, the visual detection is fast and accurate even on full rack level testing. Block 16 indicates that during system operation, leak detection is achieved by using leak sensors which would detect the presence of nanoparticles or chemical agent released from the electrical leak detection layer II. Block 18 indicates that the sensors can identify the location of the leak within the system.

Thus, by the disclosed embodiments, a leak detection and prevention apparatus is provided, comprising a visual leak detection layer comprising water soluble coloring agent, an electrical leak detection layer comprising water disbursing electrical detection agent; and a leak prevention layer comprising a water swelling material. The visual leak detection may comprise a compacted coloring powder configured for dissolving upon contacting water. The electrical leak detection layer may comprise conductive nanoparticles or a chemical agent disbursable upon contact with water, e.g., forming a solution, colloid or suspension which may change the chemical, electrical and/or optical property of the water.

FIG. 14 illustrates a process for fabricating a seal. The process may start at 11 by forming a core, generally in the form of a closed loop, e.g., a circle, rectangle, square, etc. The core is formed of a water swelling material. At 13 an electrical detection layer is formed over the core. This may be done, for example, by coating or impregnating the core with a detection agent, such as conductive nanoparticle or chemical changing material. At 15 a visual detection layer is formed over the core, e.g., by coating the core and electrical detection layer with compressed coloring powder.

According to further embodiments, a seal is provided comprising a core forming a loop, the core made of a water swelling material; an electrical detection layer provided over the core, the electrical detection layer comprising disbursable agent which disburses into the water upon contacting water and causing a change in chemical, optical and/or electrical property of the water; and a visual leak detection layer provided over the electrical detection layer and comprising a coloring agent soluble in water.

According to further embodiments, a seal is provided comprising a core forming a first loop, the core made of a water swelling material; an electrical detection layer forming a second loop smaller than the first loop, the electrical detection layer comprising disbursable agent which disburses into the water upon contacting water and causing a change in chemical, optical and/or electrical property of the water; and a visual leak detection layer forming a third loop smaller than the second loop comprising a coloring agent soluble in water.

A cold plate is provided having a first block and a second block contacting each other at a mating surface and defining a cavity there-between; the mating surface incorporating a channel and a seal loop is positioned within the channel, the seal loop comprising a first layer for visual detection of leak by incorporating coloring agent that is water soluble, a second layer for electrical detection of a leak by a sensor, the second layer incorporating disbursable agent which disburses into the water upon contacting water and causing a change in chemical, optical and/or electrical property of the water, and a third layer made of water swelling material which swells upon contact with water. The three layers may be arranged in an orientation wherein a leak from the cavity would first reach the first layer, then reach the second layer, and lastly reach the swelling layer. The layers may form independent parts placed side-by-side with the first layer forming an inner loop, the second layer forming an intermediate loop and the third layer forming an exterior loop, all concentric around the cavity, or may be integrated into a single seal loop.

A cooling system for a server comprises a plurality of cold plates and a plurality of liquid lines having ends attached to barbs, wherein each of the cold plates and at least one of the barbs incorporate a leak detection and prevention seal comprising a visual leak detection layer comprising water soluble coloring agent, an electrical leak detection layer comprising water disbursing electrical detection agent; and a leak prevention layer comprising a water swelling material; and at least one sensor for detecting change in chemical, electrical and/or optical property of cooling liquid returned from the cold plates. The visual leak detection may comprise a compacted coloring powder configured for dissolving upon contacting water. The electrical leak detection layer may comprise conductive nanoparticles or a chemical agent disbursable upon contact with water, e.g., forming a solution, colloid or suspension which may change the chemical, electrical and/or optical property of the water.

A method for leak detection and prevention is provided, wherein a seal is inserted into a cold plate, the seal having a visual leak detection layer comprising water soluble coloring agent, an electrical leak detection layer comprising water disbursing electrical detection agent, and a leak prevention layer comprising a water swelling material; mounting the cold plate onto a test jig and supplying water into the cold plate through transparent lines; visually inspecting the transparent lines to detect change in color of the water; when no color change detected, mounting the cold plate onto a cooling system of an electrical circuitry; mounting an electrical sensor onto the cooling system; monitoring the electrical sensor for an electrical signal indicating leak detection.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A seal for a cooling system installed in server rack, the cooling system having water flowing therethrough and the seal comprising:
  a visual leak detection layer comprising a water-soluble coloring agent adapted to be dispersed into the water flowing through the cooling system;
  an electrical leak detection layer comprising an electrical detection agent adapted to be dispersed into the water flowing through the cooling system; and
  an expanding layer comprising a water swelling material.

2. A cold plate, comprising:
  a first block and a second block attached to the first block at a mating surface, the first block and second block defining a cavity there-between and forming a channel in the mating surface;
  a water inlet barb forming a fluid supply to the cavity;
  a water outlet barb forming a fluid return from the cavity; and
  a seal provided in the channel, the seal comprising:
    a first layer for visual leak detection, the first layer comprising a water-soluble coloring agent adapted, upon contact with the water, to be dispersed into water flowing through the cavity or out the fluid return,
    a second layer for electrical leak detection by a sensor, the second layer comprising an electrical detection agent that is adapted, upon contact with the water, to be dispersed into the water flowing through the cavity or out the fluid return, wherein the electrical detection agent changes a chemical, optical, or electrical property of the water, and
    a third layer made of a swelling material that is adapted to swell upon contact with the water.

3. The cold plate of claim 2, further comprising a ring seal provided on the outlet barb, the ring seal comprising a first ring layer for visual detection of leak by incorporating coloring agent that is water soluble, a second ring layer for electrical detection of a leak by a sensor, the second ring layer incorporating disbursable agent which disburses into the water upon contacting the water and causing a change in chemical, optical and/or electrical property of the water, and a third ring layer made of water swelling material which swells upon contact with the water.

4. The cold plate of claim 2, wherein the first layer, second layer and third layer are integrated into a single loop.

5. The cold plate of claim 4, wherein the single loop comprises a core made of the water swelling material forming the third layer and wherein the first layer and the second layer are provided over the core.

6. The cold plate of claim 2, wherein the first layer, second layer and third layer are formed into three concentric loops, the first layer forming loop closest to the cavity.

7. The cold plate of claim 2, wherein the first layer, second layer and third layer are arranged in an orientation wherein a leak from the cavity would first reach the first layer, then reach the second layer, and lastly reach the swelling layer.

8. The cold plate of claim 2, further comprising an electrical sensor configured to detect change in chemical or electrical property of the water flowing in the fluid return from the cavity.

9. The cold plate of claim 2, further comprising a secondary sealing ring concentric with seal and positioned around the seal.

* * * * *